(12) United States Patent
Costa

(10) Patent No.: US 10,236,866 B2
(45) Date of Patent: Mar. 19, 2019

(54) PULSE WIDTH MODULATION SIGNAL FREQUENCY GENERATION

(71) Applicant: Infineon Technologies AG, Neubiberg (DE)

(72) Inventor: Pedro Costa, Munich (DE)

(73) Assignee: Infineon Technologies AG, Neubiberg (DE)

(*) Notice: Subject to any disclaimer, the term of this patent is extended or adjusted under 35 U.S.C. 154(b) by 16 days.

(21) Appl. No.: 15/497,644

(22) Filed: Apr. 26, 2017

(65) Prior Publication Data

US 2018/0316336 A1  Nov. 1, 2018

(51) Int. Cl.
*H03K 3/017* (2006.01)
*H03L 7/081* (2006.01)

(52) U.S. Cl.
CPC ............ *H03K 3/017* (2013.01); *H03L 7/0812* (2013.01)

(58) Field of Classification Search
CPC ..... H03K 3/017; H03L 7/0812; H03L 7/0814; H03L 7/0818

USPC ........ 327/172, 173, 174, 175, 176, 291, 299
See application file for complete search history.

(56) References Cited

U.S. PATENT DOCUMENTS

| 6,597,735 B1* | 7/2003 | Baba ................. G06F 1/025 375/238 |
| 2005/0030206 A1* | 2/2005 | Li ........................ H03K 7/08 341/53 |
| 2011/0193648 A1* | 8/2011 | Zhao .................... H03K 7/08 332/109 |

* cited by examiner

*Primary Examiner* — William Hernandez
(74) *Attorney, Agent, or Firm* — Schiff Hardin LLP

(57) ABSTRACT

A timer including a Pulse Width Modulation (PWM) signal generator configured to generate, based on a clock, a PWM signal having a first frequency resolution; a PWM time shifter configured to receive from the PWM signal generator the PWM signal having the first frequency resolution, and output a PWM signal having a second frequency resolution, wherein the second frequency resolution is higher than the first frequency resolution; and a control monitor configured to: control the PWM time shifter to time shift rising edges or falling edges of the PWM signal by an amount corresponding with a second frequency resolution.

20 Claims, 9 Drawing Sheets

100
Timer

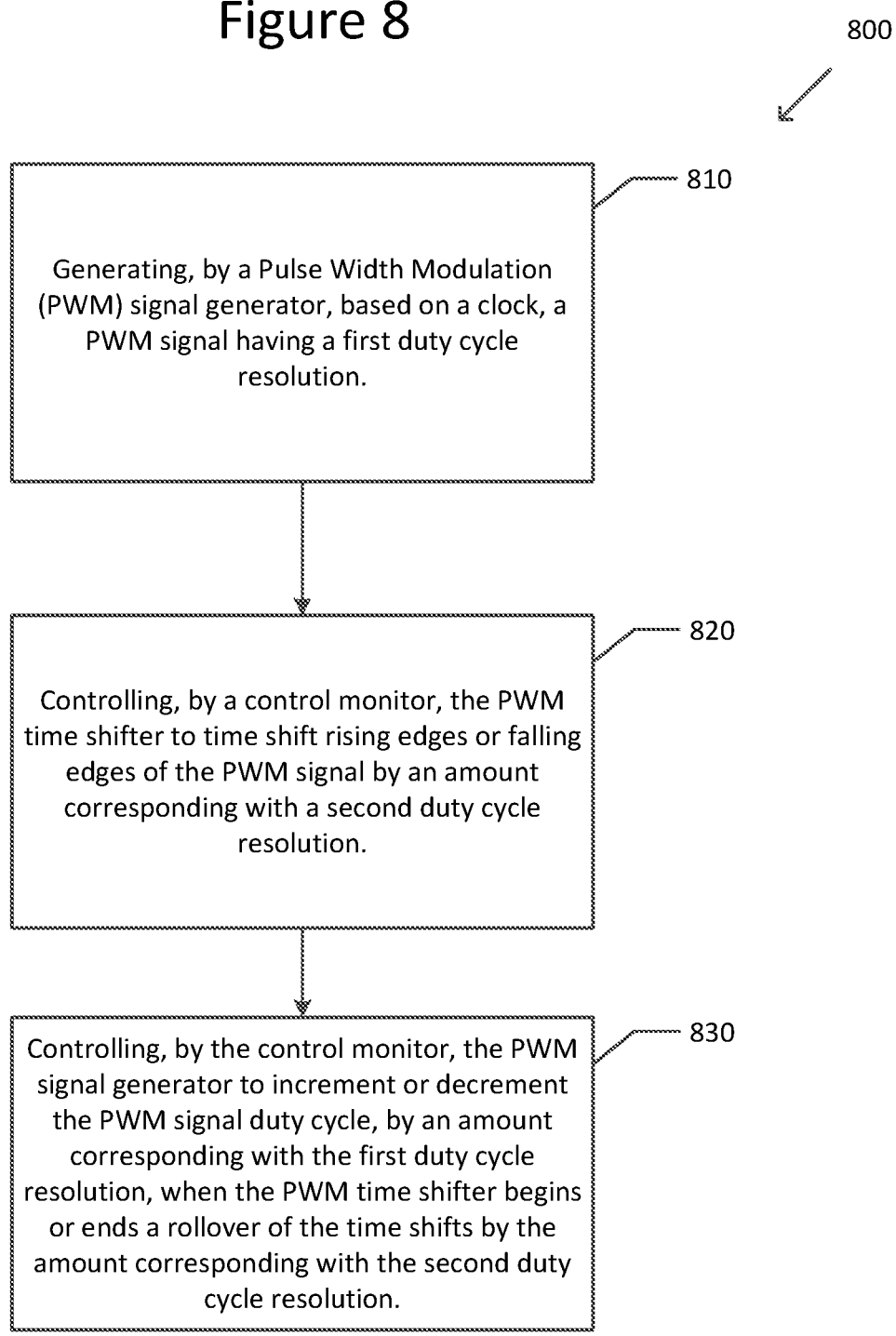

PULSE WIDTH MODULATION SIGNAL FREQUENCY GENERATION

BACKGROUND

Sensor and actuator applications comprise two main functions that are controlled by microcontroller peripherals, that is, voltage and current sensing via Analog-to-Digital Converters (ADC), and actuator control via timers.

An important factor in sensor and actuator applications is the accuracy of the control loop. Higher accuracy results in improved efficiency; this is particularly relevant in applications such as motor control, digital power conversion, and injection control. However, the higher the switching frequency, the more limited the resolution.

A challenge in increasing resolution of the control loop is the accuracy of the timers with respect to Pulse Width Modulation (PWM) frequency adjustment. In order to have a timer that can generate a PWM signal having a frequency encoded with a resolution of 14 bits for an actuator that operates around 200 kHz, the internal timer clock should be approximately 3.2 GHz. Such a high clock frequency is difficult to generate within state of the art microcontrollers.

A current solution involves timers running at maximum possible speeds. However, a majority of timers available inside state of the art microcontrollers cannot surpass hundreds of megahertz. This solution therefore cannot achieve a high enough accuracy.

An alternative solution implements logic operating in the gigahertz range by means of implementing a full custom design. However, this second solution is expensive to implement with full custom logic running at high frequency. Also, this solution is not scalable; every time a new device is developed, the logic needs to be redesigned dependent on the device's clock frequency.

BRIEF DESCRIPTION OF THE DRAWINGS

FIG. 8 illustrates a flowchart of a method of generating a PWM signal duty cycle in accordance with exemplary aspects of the disclosure.

DETAILED DESCRIPTION

The present disclosure is directed to a timer that divides Pulse Width Modulated (PWM) signal generation into two stages—a low accuracy stage and a high accuracy stage—to generate a more accurate PWM signal frequency. The timer of this disclosure is not directed to generating a PWM signal with increased/decreased frequency, but rather to a PWM signal with increased frequency resolution.

The low accuracy stage involves a PWM signal generator generating a PWM signal having a first, low accuracy frequency resolution based on a clock.

The high accuracy stage involves a PWM time shifter time shifting a rising/falling edge of the PWM signal by an amount corresponding with a second frequency resolution, wherein the second frequency resolution is higher than the first frequency resolution. Also, a control monitor controls the PWM signal generator to increment/decrement the PWM signal period by an amount corresponding with the first frequency resolution, when the time shift by the PWM time shifter begins/ends a rollover.

Figure 1:
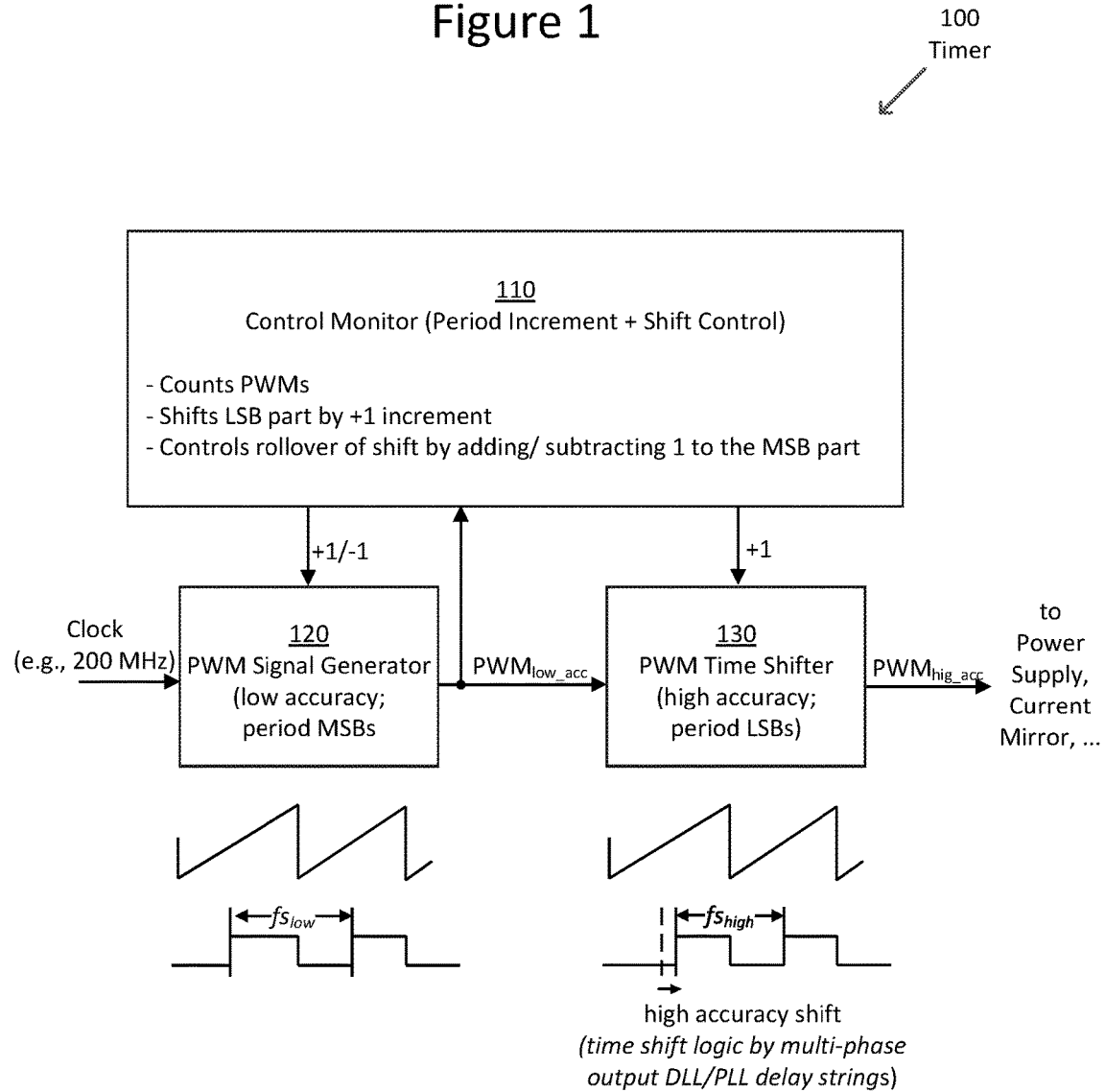
FIG. 1 illustrates a schematic diagram of a timer for generating a Pulse Width Modulated (PWM) signal frequency in accordance with exemplary aspects of the disclosure.

FIG. 1 illustrates a schematic diagram of a timer 100 for generating a Pulse Width Modulated (PWM) signal frequency in accordance with exemplary aspects of the disclosure.

The timer 100 comprises a control monitor 110, a PWM signal generator 120, and a PWM time shifter 130.

The PWM signal generator 120 is configured to generate, based on a relatively low-speed clock (e.g., 200 MHz), a low accuracy PWM signal ($PWM_{low\_acc}$), which has a first frequency resolution. This low accuracy PWM signal frequency may be referred to as a most significant portion of the PWM signal frequency. A frequency value may represented by a most significant part and a least significant part, where the most significant part is the low accuracy portion of the PWM signal frequency, and the least significant part is the high accuracy portion of the PWM signal frequency.

The PWM time shifter 130 is configured to time shift a rising edge of the low accuracy PWM signal $PWM_{low\_acc}$ by an amount corresponding with a second frequency resolution, as shown in the timing diagram pictured below the PWM time shifter 130. The second frequency resolution is higher than the first frequency resolution, and may be referred to as the least significant portion of the PWM signal frequency. Alternatively, the PWM time shifter 130 may be configured to time shift a falling edge of the low accuracy PWM signal $PWM_{low\_acc}$, depending on the specific design.

The PWM time shifter 130 outputs a high accuracy PWM signal ($PWM_{high\_acc}$). The high accuracy PWM signal ($PWM_{high\_acc}$) may be output by the PWM time shifter 130 to a power supply, a current mirror, and any other circuit, with possibly a driver coupled therebetween.

The control monitor 110 is configured to control the PWM signal generator 120 to increment (+1) or decrement (−1) the PWM signal period by an amount corresponding with the first frequency resolution (i.e., the most significant portion of the PWM signal frequency), when the time shift by the PWM time shifter begins or ends a rollover (i.e., the least significant portion of the PWM signal frequency).

An advantage of the timer 100 is there are no components operating at high frequency, and the timer 100 can be used to generate a PWM frequency having a relatively high accuracy. Other advantages are that the control monitor 110 that is counting the PWM signal operates in a frequency range of the PWM signal, making the control monitor 110 simple and inexpensive to implement. Also, the PWM time shifter 130 may be used for a large range of timer clock frequencies, or may even be agnostic to the timer clock, meaning the clock can be divided into different time shifts, so the actual speed of the clock is not relevant.

Figure 2:
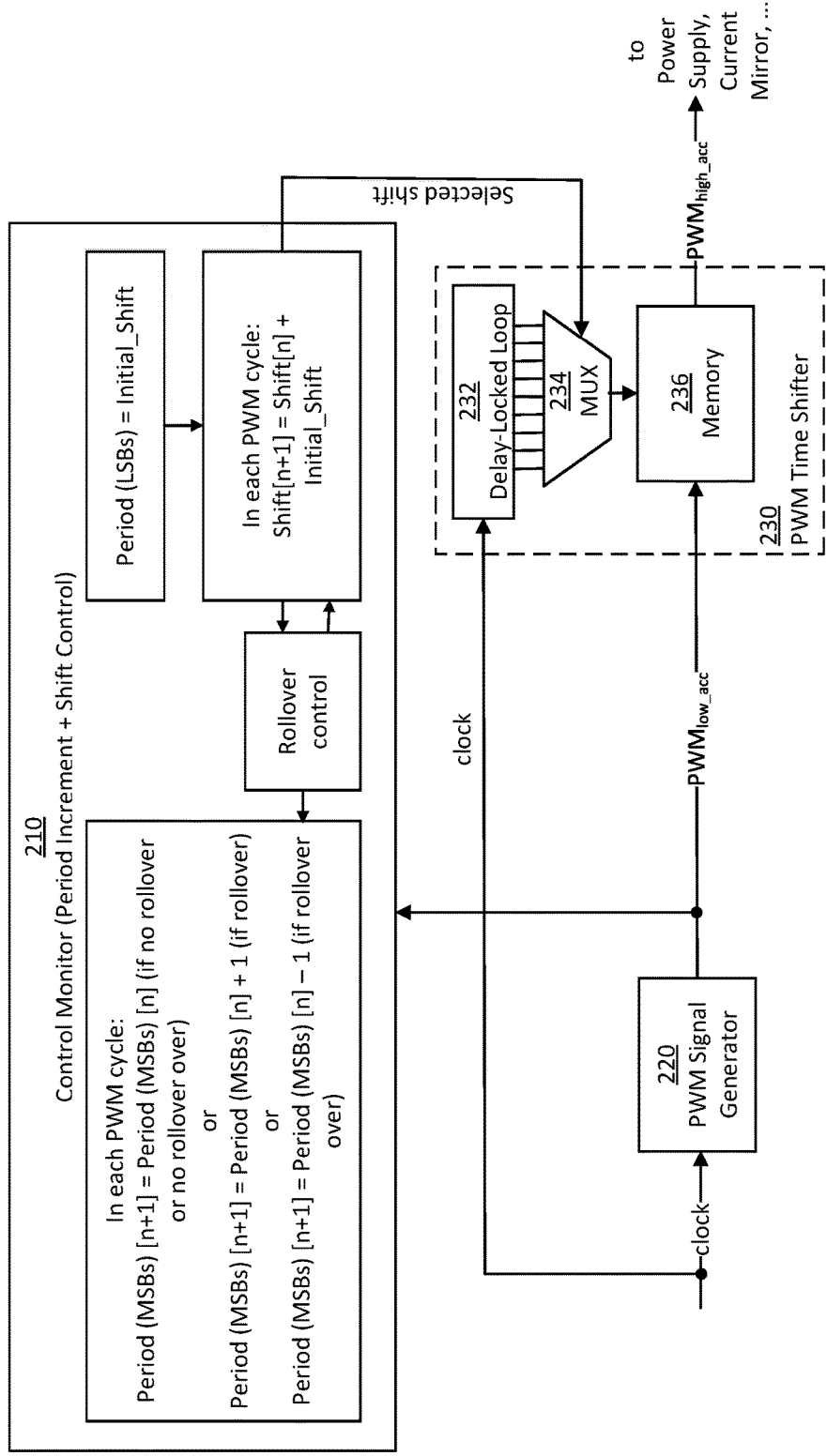
FIG. 2 illustrates a more detailed schematic diagram of the timer of FIG. 1 in accordance with exemplary aspects of the disclosure.

FIG. 2 illustrates a more detailed schematic diagram of a timer 200 in accordance with exemplary aspects of the disclosure. The timer 200 corresponds with the timer 100 of FIG. 1.

The timer 200 comprises a control monitor 210, a PWM signal generator 220, and a PWM time shifter 230. The control monitor 210 and the PWM signal generator 220 correspond with the control monitor 110 and the PWM signal generator 120 of the timer 100 of FIG. 1. The PWM time shifter 230 in this more detailed example comprises a Delay-Locked Loop (DLL) 232, a multiplexer 234, and a memory 236.

As discussed above, as a first stage, the timer 200 is implemented via a conventional PWM signal generator 220 that generates a PWM signal having a relatively low clock frequency, e.g., 200 MHz, which is a most significant portion of the PWM signal frequency.

As a second stage, there is the PWM time shifter 230, which time shifts a rising edge of the PWM signal, but alternatively may be the falling edge. In this example the PWM timer shifter comprises a DLL 232. This DLL 232 is configured to divide the clock into a plurality of signals, and then one of these signals is selected in accordance with a selected shift signal received from the control monitor 210 as the time shift; for example, one clock is divided into 50 slots, and then one of these slots is selected as the high accuracy portion (i.e., least significant portion) of the PWM signal frequency. As will be discussed in further detail below with respect to the timing diagram of FIG. 4, after the first stage the PWM signal has a period of, for example, 6 clock cycles, and then after the second stage causing a time shift of, for example, ½ clock cycle, the PWM signal has a period that is 6.5 clock cycles. The most significant portion of the PWM signal frequency is the 6 clock cycles, and the least significant portion is the ½ clock cycle.

The control monitor 210 performs period increment and shift control. More specifically, the control monitor 210 automatically shifts a rising or falling edge (in this example, a rising edge) of the low accuracy PWM signal ($PWM_{low\_acc}$) having a first frequency resolution to maintain a desired PWM signal frequency having a second frequency resolution, which is higher than the first frequency resolution. The control monitor 210 thus shifts in each PWM period the least significant portion (i.e., an initial shift), and if the least significant portion has rollover, increments the period by the most significant portion, that is a clock cycle.

The high accuracy PWM signal frequency ($PWM_{high\_acc}$) is dependent on the accuracy of the least significant portion shifts, which may be implemented using a DLL as shown, or alternatively, with delay chains, multi-phase clock generation circuitry such as Phase-Locked Loops (PLLs), etc. The accuracy of the PWM signal frequency can be as fine as tens of picoseconds.

Figure 3:
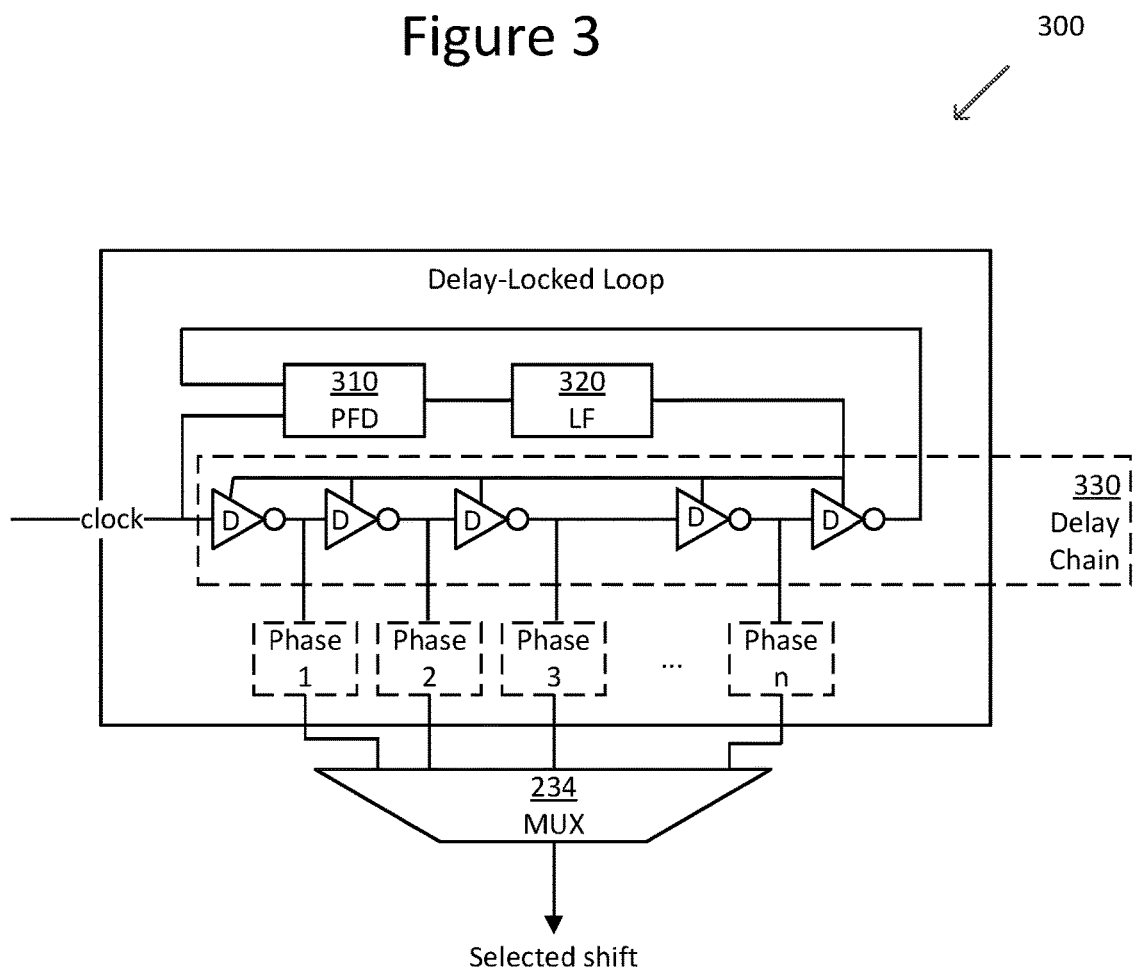
FIG. 3 illustrates a schematic diagram of a Delay-Locked Loop (DLL) of the timer of FIGS. 1 and 2 in accordance with exemplary aspects of the disclosure.

FIG. 3 illustrates a schematic diagram of a Delay-Locked Loop (DLL) 300 of the PWM time shifter 130/230 of FIGS. 1 and 2 in accordance with exemplary aspects of the disclosure. The DLL 300 corresponds with the DLL 232 of FIG. 2.

The DLL 300 comprises a Phase Frequency Detector (PFD) 310, a loop filter (LF) 320, and a delay chain 330 of delay circuits, which are known components of a DLL. Thus for the sake of brevity, their descriptions will be omitted here.

The multiplexer 234 is the multiplexer 234 of FIG. 2. The delay chain 330 comprises a chain of delay circuits. The multiplexer 234 comprises inputs coupled to respective nodes between the delay circuits of the delay chain 330, and is configured to select, based on a selected shift signal received from the control monitor 110/210, one of the inputs, which correspond with phases 1 . . . n. The multiplexer 234 then outputs the selected shift to the memory 236 of FIG. 2. The memory 236 is a logical element, such as a flip-flop, for storing whether the PWM signal is high or low.

The shift in the DLL 300 could be performed using pure decimal coding, for example, 1 means first phase (e.g., 150 picoseconds), 2 means second phase (e.g., 300 picoseconds), etc. In each PWM clock cycle the shift is a decimal, and the phase is incrementally selected for each clock cycle.

Figure 4:
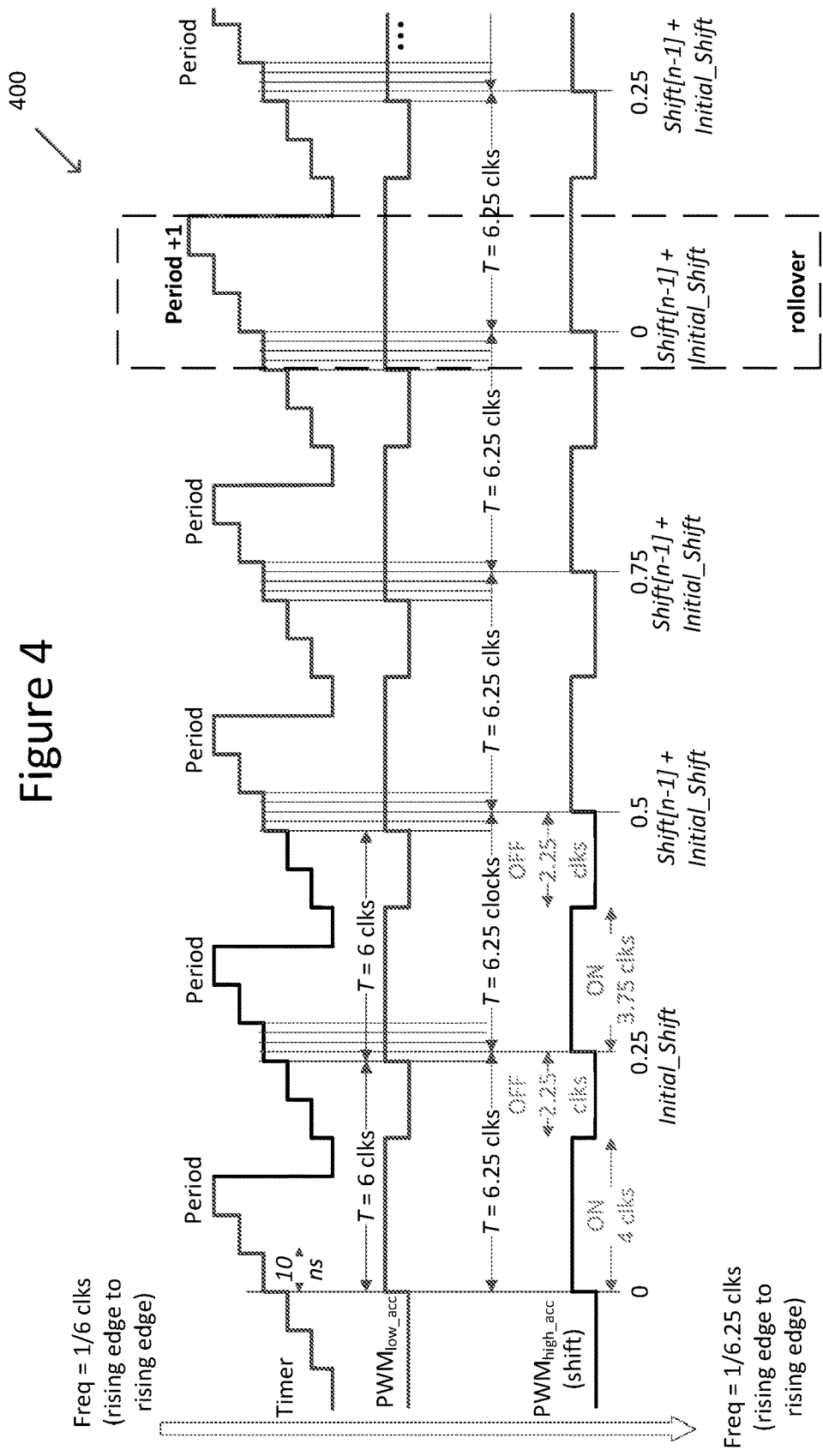
FIG. 4 illustrates a timing diagram of low and high accuracy PWM signal frequencies of the timer of FIGS. 1 and 2 in accordance with exemplary aspects of the disclosure.

FIG. 4 illustrates timing diagrams 400 of a timer clock, a low accuracy PWM signal ($PWM_{low\_acc}$), and a high accuracy PWM signal ($PWM_{high\_acc}$) of the timer 100/200 of FIGS. 1 and 2 in accordance with exemplary aspects of the disclosure.

The accuracy of the PWM signal frequency is dependent on the timer clock. The problem is that with high switching frequencies, this resolution of the timer clock is not sufficient because the switching frequency quantization error is not acceptable. If the maximum switching frequency is 10 kHz and a desired resolution is 14 bits, then the maximum acceptable error is 100000 ns/16383=6.1 ns. But if the maximum switching frequency is 1 MHz and the desired resolution is 14 bits, then the maximum acceptable error is 0.061 ns. Thus if the switching frequency is increased, the resolution steps need to be increased to maintain the same quantization error specification.

The timing diagram 400 illustrates an example in which there is a period of 6 clock cycles from rising edge to rising edge, but what is desired is a frequency in which there is a 6.25 MHz cycle period. In this example, the frequency is converted from 16.6667 MHz to exactly 16 MHz assuming a timer clock of 100 MHz. Such a conversion would not be possible to achieve with the conventional timer without the second stage.

More specifically, the PWM signal generator 120/220 outputs a low accuracy PWM signal ($PWM_{low\_acc}$) having a period of six clock cycles, in this example. This low accuracy PWM signal ($PWM_{low\_acc}$) has a first frequency resolution. The PWM time shifter 130/230 is controlled by the control monitor 110/210 to time shift the rising edge of the low accuracy PWM signal ($PWM_{low\_acc}$) by, for example, 0.25 clocks each period to result in a high accuracy PWM signal ($PWM_{high\_acc}$) having a second resolution, which is higher than the first resolution.

The rising edge of the PWM signal is a combination of the most significant portion of the PWM signal frequency (course tune) and the least significant portion of the PWM signal frequency (fine tune). There is a repeated fine tune shift until a full clock cycle shift is reached, and then there is a rollover to the beginning of the clock cycle again.

More specifically, in the first period the rising edge of the PWM signal has an initial shift of 0.25 clock cycles. The next period has the time shift of the previous period (shift [n−1] having 0.25 clock cycles) plus an additional 0.25 clock cycles for a total time shift of 0.5 clock cycles. The next period of the PWM signal has the time shift of the previous period (0.5 clock cycles) plus an additional time shift of 0.25 clock cycles for a total time shift of 0.75 clock cycles. Then finally the next period the PWM signal has the time shift of the previous period (0.75 clock cycles) plus an additional time shift of 0.25 clock cycles for a total time shift of one full clock cycle.

At this point, four of the 0.25 time shifts results in a full clock cycle shifted, and thus there is a rollover. As can be seen, the rollover begins at a time when the time-shifted PWM signal has a rising edge corresponding with a rising edge of the cycle of the clock. For the rollover, the control monitor 110/210 controls the PWM signal generator 120/220 to increment the PWM signal period by one clock cycle, which is the amount corresponding with the first frequency resolution. The result is this period with the rollover has an additional clock cycle (seven instead of six). Then in the period following the period of the rollover, the control monitor 110/210 is configured to control the PWM signal generator 120/220 to decrement the PWM signal by the same amount (a clock cycle) to return the period to six clock cycles.

The PWM signal with high resolution switching frequency ($PWM_{high\_acc}$) may be from rising edge to rising edge, as shown in the example of FIG. 4, or alternatively, from falling edge to falling edge. The chosen edge depends on whether the timer sets the PWM signal to be high when above a predetermined value, or vice-versa. FIG. 4 illustrates the PWM signal being high when the timer is above a certain value, and low when below. This is merely a design choice.

Figure 5:
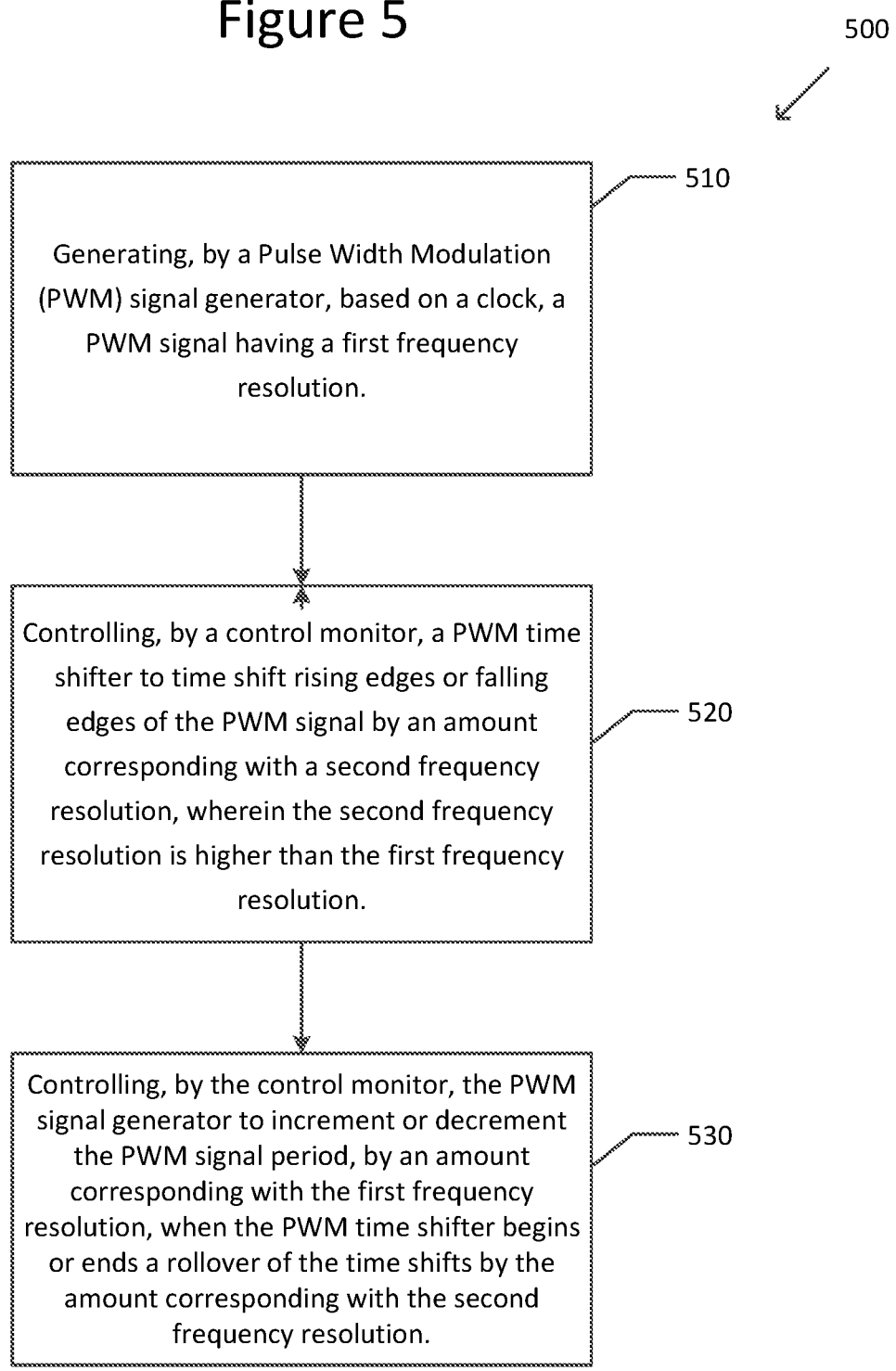
FIG. 5 illustrates a flowchart of a method of generating a PWM signal frequency in accordance with exemplary aspects of the disclosure.

FIG. 5 illustrates a flowchart of a method 500 of generating a PWM signal frequency in accordance with exemplary aspects of the disclosure.

In Steps 510, the Pulse Width Modulation (PWM) signal generator 120/220 generates, based on a clock, a PWM signal having a first frequency resolution.

In Step 520, controlling, by the control monitor 110/210, the PWM time shifter 130/230 to time shift rising edges or falling edges of the PWM signal by an amount corresponding with a second frequency resolution, wherein the second frequency resolution is higher than the first frequency resolution.

In Step 530, controlling, by the control monitor 110/210, the PWM signal generator 120/220 to increment or decrement the PWM signal period, by an amount corresponding with the first frequency resolution, when the PWM time shifter 130/230 begins or ends a rollover of the time shifts by the amount corresponding with the second frequency resolution.

Figure 6:
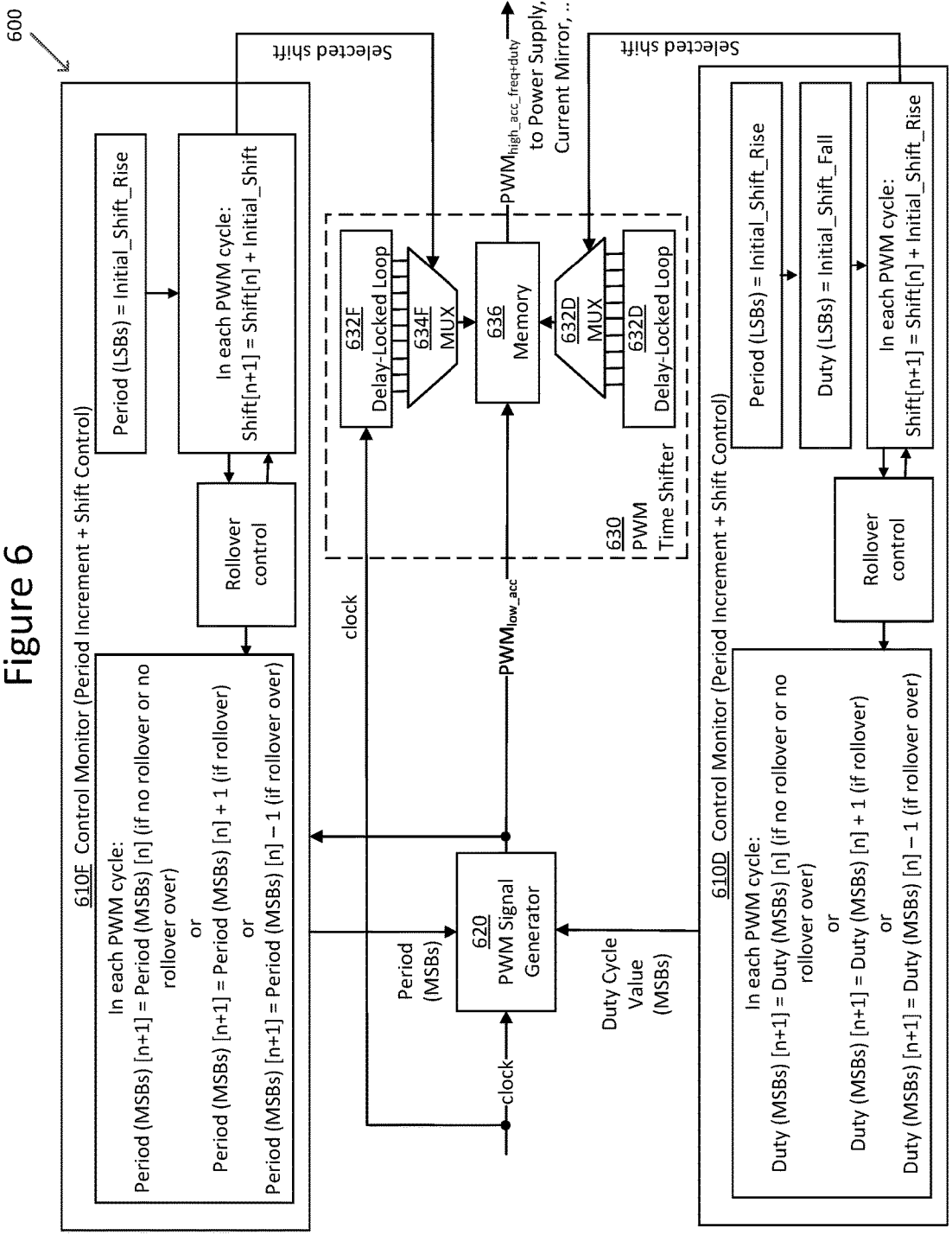
FIG. 6 illustrates a schematic diagram of a timer for generating a PWM signal frequency and a PWM signal duty cycle in accordance with exemplary aspects of the disclosure.

FIG. 6 illustrates a schematic diagram of a timer 600 for generating a PWM signal frequency a PWM signal duty cycle in accordance with exemplary aspects of the disclosure. A duty cycle is the portion of one period in which a signal is active or high.

The timer 600 comprises a control monitor 610F, a PWM signal generator 620, DLL 632F, multiplexer 634F, and memory 636, which correspond with the control monitor 210, PWM signal generator 220, PWM time shifter 230, DLL 632, multiplexer 634F, and memory 636 of the timer 200 of FIG. 2.

The timer 200 generates a PWM signal frequency resolution. However, the process of generating a high resolution PWM frequency, as discussed above with respect to FIGS. 1-5, may result in degradation of the PWM signal duty cycle. The timer 600 extends timer 200 of FIG. 2 to additionally control resolution of the duty cycle.

The timer 600 additionally comprises a control monitor 610D, a DLL 632D, and a multiplexer 632D to additionally control resolution of the duty cycle. The PWM time shifter 630 is illustrated to include the DLL 632F, multiplexer 632F, memory 636, DLL 632D, and multiplexer 632D, for the duty cycle resolution control portion of the timer 600.

The PWM signal generated by the PWM signal generator 620 has a first duty cycle resolution, along with a first frequency resolution as discussed above.

The PWM time shifter 630 is further configured to time shift the PWM signal rising edge or falling edge which is not shifted for adjustment of the frequency resolution as discussed above, by an amount corresponding with a second duty cycle resolution. The second duty cycle resolution is higher than the first duty cycle resolution. The amount of time shift corresponding with the second frequency resolution, discussed above, and the amount of time shift corresponding with the second duty cycle resolution may be equal or different.

While the generation of the PWM signal duty cycle is shown and described as being in addition to the generation of the PWM signal frequency, the disclosure is not limited in this respect. It is also possible to adjust the resolution of the duty cycle without adjustment of the resolution of the frequency.

Figure 7A:
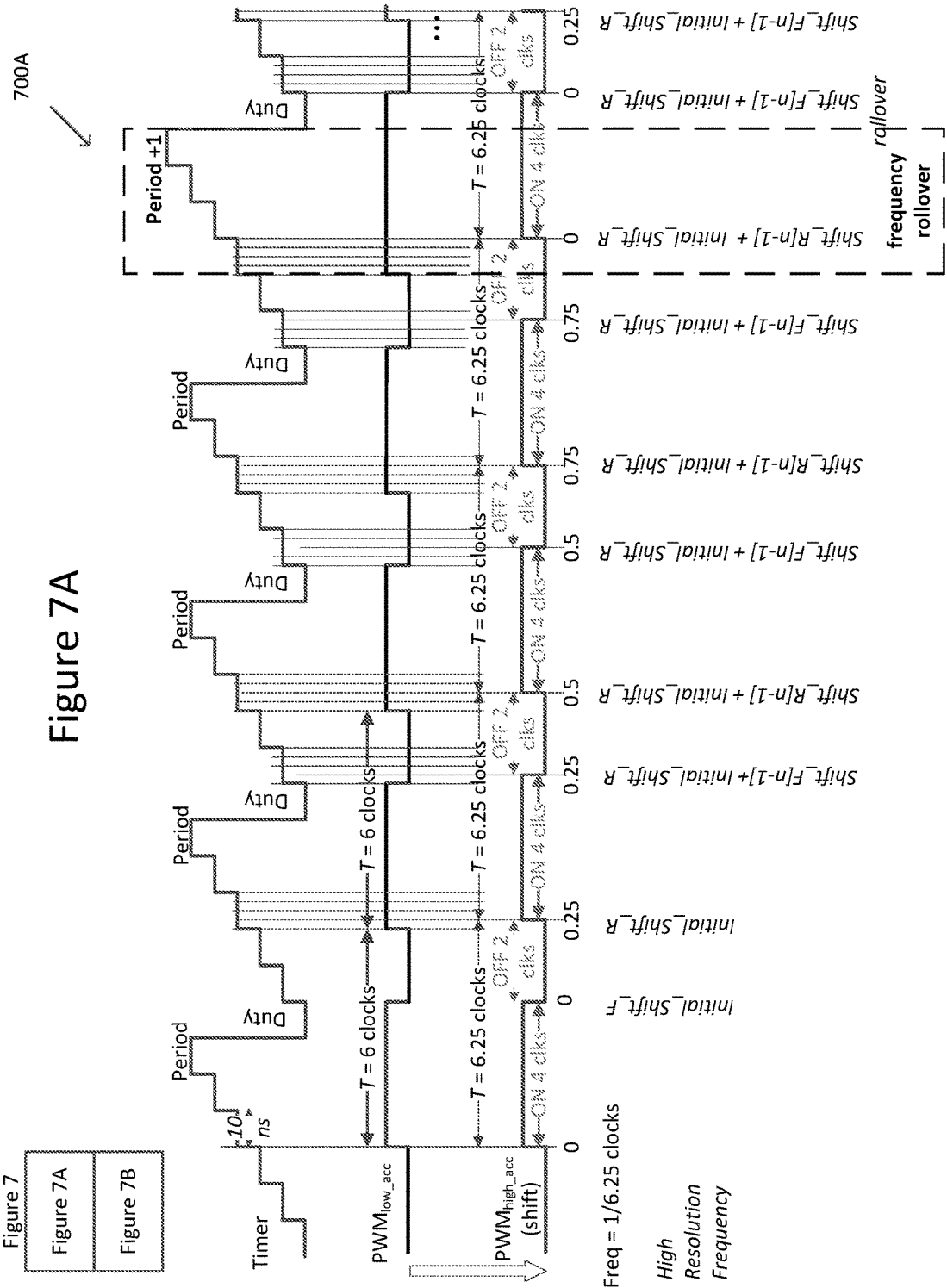
FIGS. 7A and 7B illustrate a timing diagram of low and high accuracy PWM frequencies and low and high accuracy PWM signal duty cycles of the timer of FIG. 6 in accordance with exemplary aspects of the disclosure.
Figure 7B:
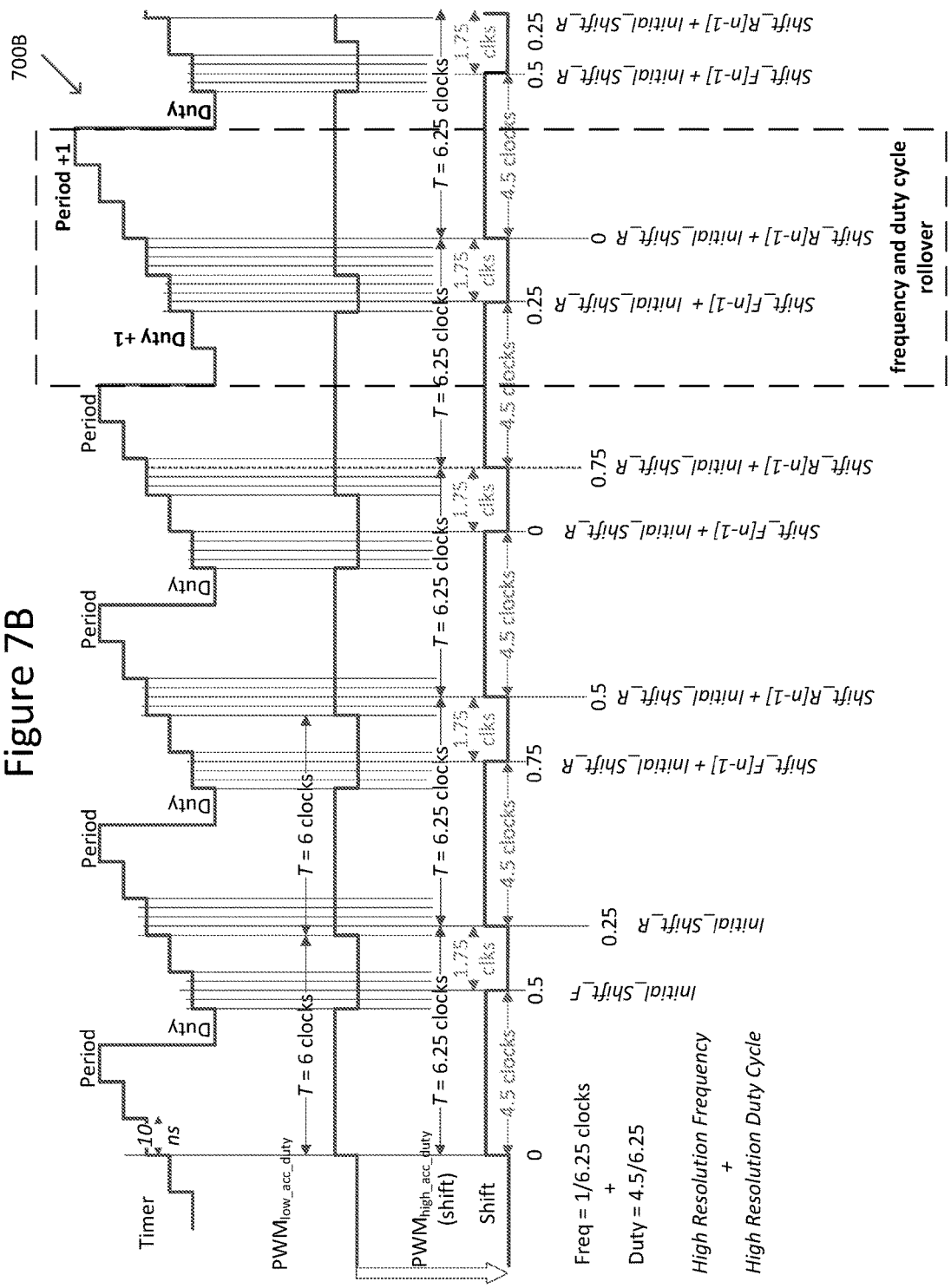

FIGS. 7A and 7B illustrate a timing diagram 700 (700A+700B) of low and high accuracy PWM frequencies and of low and high accuracy PWM signal duty cycles of the timer 600 of FIG. 6 in accordance with exemplary aspects of the disclosure.

FIG. 7A illustrates timing diagrams 700 of a timer clock, a low accuracy PWM signal ($PWM_{low\_acc}$), and a high accuracy PWM signal ($PWM_{high\_acc}$) of the timer 600 of FIG. 6. These timing diagrams 700A are similar to the timing diagrams of FIG. 4 discussed above.

FIG. 7B illustrates timing diagrams 700 of a timer clock, a low accuracy/resolution duty cycle PWM signal ($PWM_{low\_acc\_duty}$), and a high accuracy/resolution duty cycle PWM signal ($PWM_{high\_acc\_duty}$) of the timer 600 of FIG. 6.

There are two scenarios shown in FIG. 7B. The first scenario has an ON time for the duty as an integer value, that is, 4 (4/6.25). The second scenario has an ON time for the duty cycle that is a fractional value, that is, 4.5 (4.5/6.25). The difference between the two scenarios is based on whether or not an integer ON/OFF value is desired. If an integer value for the ON/OFF time is desired, then no adjustment is needed on the rollover for the duty cycle control, because the increase is the same as for the frequency control discussed above. On the other hand, if a fractional value for the ON/OFF is desired, that is a duty cycle having a high resolution, then an additional rollover increment/decrement process similar to that as discussed above for the frequency resolution adjustment is needed for the duty cycle resolution adjustment.

Since the frequency resolution example is considered between rising edges of the PWM signal, the duty cycle resolution increase is considered between falling edges of the PWM signal. Controlling frequency resolution and duty cycle resolution at the same time thus involves shifting both rising and falling edges of the PWM signal. If both shifts are the same, then there is no need to increment/decrement the duty cycle least significant portion as it is already being done for the frequency least significant portion. If the time shifts are different, however, then the second multiplexer 632D is needed for the shift for adjusting the duty cycle resolution.

The shifting of the PWM signal with respect to duty cycle resolution is similar to that of the frequency resolution discussed above. For the sake of brevity, the details will not be repeated here. However, it is noted that the control monitor 610D is configured to control the PWM signal generator 620 to increment the PWM signal by the amount corresponding with the low accuracy duty cycle resolution in a period following a period in which a rollover begins, and decrement the PWM signal in a period that follows an end of a rollover.

FIG. 8 illustrates a flowchart of a method 800 of generating a PWM signal duty cycle in accordance with exemplary aspects of the disclosure.

In Step 810, generating, by the Pulse Width Modulation (PWM) signal generator 620, based on a clock, a PWM signal having a first duty cycle resolution.

In Step 820, controlling, by the control monitor 610D, the PWM time shifter 630 to time shift rising edges or falling edges of the PWM signal by an amount corresponding with a second duty cycle resolution.

In Step 830, controlling, by the control monitor 610D is the PWM signal generator 620 to increment or decrement the PWM signal duty cycle, by an amount corresponding with the first duty cycle resolution, when the PWM time shifter begins or ends a rollover of the time shifts by the amount corresponding with the second duty cycle resolution.

Central Processing Unit (CPU) clock speeds are trending higher. The subject matter of this disclosure provides a method in which a PWM signal is generated with an accuracy of tens of picoseconds around a predetermined frequency, without dependency on a main clock frequency, and without digital logic operating at high frequencies.

While the foregoing has been described in conjunction with exemplary embodiment, it is understood that the term "exemplary" is merely meant as an example, rather than the best or optimal. Accordingly, the disclosure is intended to cover alternatives, modifications and equivalents, which may be included within the scope of the disclosure.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This disclosure is intended to cover any adaptations or variations of the specific embodiments discussed herein.

What is claimed is:

1. A timer, comprising:
a Pulse Width Modulation (PWM) signal generator configured to generate, based on a clock, a PWM signal having a first frequency resolution;
a PWM time shifter configured to receive from the PWM signal generator the PWM signal having the first frequency resolution, and output a PWM signal having a second frequency resolution, wherein the second frequency resolution is higher than the first frequency resolution; and
a control monitor configured to:
control the PWM time shifter to time shift rising edges or falling edges of the PWM signal by an amount corresponding with the second frequency resolution, and
control the PWM signal generator to increment or decrement the PWM signal period, by an amount corresponding with the first frequency resolution, when the PWM time shifter begins or ends a rollover of the time shifts by the amount corresponding with the second frequency resolution.

2. The timer of claim 1, wherein the first frequency resolution corresponds with a cycle of the clock.

3. The timer of claim 2, wherein the rollover begins when the time-shifted PWM signal has a rising edge or a falling edge corresponding with a rising edge or a falling edge of the cycle of the clock.

4. The timer of claim 1, wherein the control monitor is configured to control the PWM signal generator to increment the PWM signal period by the amount corresponding with the first frequency resolution in a same period as the rollover.

5. The timer of claim 4, wherein the control monitor is configured to control the PWM signal generator to decrement the PWM signal period by the amount corresponding with the first frequency resolution in a period following the period of the rollover.

6. The timer of claim 1, wherein the PWM time shifter is configured to:
divide the clock signal into a plurality of slots; and
select one of the plurality of slots as the amount of time shift corresponding with the second frequency resolution, based on a selected shift signal received from the control monitor.

7. The timer of claim 1, wherein the PWM time shifter comprises a Delay-Locked Loop (DLL).

8. The timer of claim 7, wherein the DLL comprises:
a chain of delay circuits; and
a multiplexer comprising inputs coupled to respective nodes between the delay circuits, and configured to select, based on a selected shift signal received from the control monitor, one of the inputs corresponding to the selected shift signal.

9. The timer of claim 1, wherein the PWM time shifter comprises a Phase-Locked Loop (PLL).

10. The timer of claim 1, wherein the PWM time shifter is configured to output the PWM signal having the second frequency resolution to a switched mode power supply.

11. The timer of claim 1,
wherein the PWM signal generated by the PWM signal generator has a first duty cycle resolution, and
wherein the PWM time shifter is further configured to time shift the other of the rising edges and falling edges of the PWM signal by an amount corresponding with a second duty cycle resolution, wherein the second duty cycle resolution is higher than the first duty cycle resolution.

12. The timer of claim 11, wherein the amount of time shift corresponding with the second frequency resolution and the amount of time shift corresponding with the second duty cycle resolution are equal.

13. The timer of claim 11, wherein the amount of time shift corresponding with the second frequency resolution and the amount of time shift corresponding with the second duty cycle resolution are different.

14. A timer, comprising:
a Pulse Width Modulation (PWM) signal generator configured to generate, based on a clock, a PWM signal having a first duty cycle resolution;
a PWM time shifter configured to receive from the PWM signal generator the PWM signal having the first duty cycle resolution, and output a PWM signal having a second duty cycle resolution, wherein the second duty cycle resolution is higher than the first duty cycle resolution; and
a control monitor configured to:
control the PWM time shifter to time shift rising edges or falling edges of the PWM signal by an amount corresponding with the second duty cycle resolution, and control the PWM signal generator to increment or decrement the PWM signal duty cycle, by an amount corresponding with the first duty cycle resolution, when the PWM time shifter begins or ends a rollover of the time shifts by the amount corresponding with the second duty cycle resolution.

15. The timer of claim 14, wherein the first duty cycle resolution corresponds with a cycle of the clock.

16. The timer of claim 15, wherein the rollover begins when the time-shifted PWM signal has a rising edge or a falling edge corresponding with a rising edge or a falling edge of the cycle of the clock.

17. The timer of claim 14, wherein the control monitor is configured to control the PWM signal generator to increment the PWM signal period by the amount corresponding with the first duty cycle resolution in a period following a period in which the rollover occurs.

18. The timer of claim 17, wherein the control monitor is configured to control the PWM signal generator to decrement the PWM signal period by the amount corresponding with the first duty cycle resolution in a period that follows an end of the rollover.

19. A method of operating a timer, comprising:
generating, by a Pulse Width Modulation (PWM) signal generator, based on a clock, a PWM signal having a first frequency resolution;
controlling, by a control monitor, a PWM time shifter to time shift rising edges or falling edges of the PWM signal by an amount corresponding with a second frequency resolution, wherein the second frequency resolution is higher than the first frequency resolution; and
controlling, by the control monitor, the PWM signal generator to increment or decrement the PWM signal period, by an amount corresponding with the first frequency resolution, when the PWM time shifter begins or ends a rollover of the time shifts by the amount corresponding with the second frequency resolution.

20. The method of claim 19,
wherein the PWM signal generated by the PWM signal generator has a first duty cycle resolution, and
wherein the method further comprises:
controlling, by the control monitor, the PWM time shifter to time shift the other of the rising edges or falling edges of the PWM signal by an amount corresponding with a second duty cycle resolution, wherein the second duty cycle resolution is higher than the first duty cycle resolution, and
controlling, by the control monitor, the PWM signal generator to increment or decrement the PWM signal duty cycle, by an amount corresponding with the first duty cycle resolution, when the PWM time shifter begins or ends a rollover of the time shifts by the amount corresponding with a second duty cycle resolution.

* * * * *